US006368683B1

(12) United States Patent
Shirasaki

(10) Patent No.: US 6,368,683 B1
(45) Date of Patent: Apr. 9, 2002

(54) PELLICLE FOR PHOTOLITHOGRAPHY

(75) Inventor: Toru Shirasaki, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/534,526

(22) Filed: Mar. 27, 2000

(30) Foreign Application Priority Data

Apr. 2, 1999 (JP) .......................................... 11-096253

(51) Int. Cl.⁷ ................................................. G03F 1/14
(52) U.S. Cl. ............................................ 428/14; 430/5
(58) Field of Search ................................ 428/14; 430/5

(56) References Cited

U.S. PATENT DOCUMENTS 5,693,382 A * 12/1997 Hamada et al. ................ 428/14

FOREIGN PATENT DOCUMENTS

| JP | 63-26251 | 2/1988 |
| JP | 2-62542 | 3/1990 |

* cited by examiner

*Primary Examiner*—Alexander S. Thomas
(74) *Attorney, Agent, or Firm*—Oliff & Berridge, PLC

(57) ABSTRACT

There is disclosed a pellicle for photolithography comprising at least a pellicle membrane adhered to a pellicle frame, wherein the pellicle membrane exhibits light transmission of 50% or more when it is irradiated by an excimer laser having a wavelength of 160 nm or less. The present invention provides a pellicle for photolithography comprising a pellicle membrane of high light transmission and excellent durability even after long term irradiation with a vacuum ultraviolet light of a short wavelength.

11 Claims, No Drawings

PELLICLE FOR PHOTOLITHOGRAPHY

BACKGROUND OF THE INVENTION

1. Field of the Invention

The present invention relates to a pellicle for photolithography, in particular, a pellicle for photolithography that realizes excellent light transmission and high resolution in the vacuum ultraviolet region.

2. Related Art

In the production of semiconductor devices such as LSIs and VLSIs or liquid crystal display panels, patterning has conventionally been attained by irradiating light on semiconductor wafers or substrates for liquid crystal panels. In this case, dust particles adhered to a substrate to be exposed with the light may cause a problem. That is, a transferred pattern may be deformed or edge lines of the pattern may be rugged without smoothness, because the dust particles may absorb or reflect the light. Therefore, dimension, appearance, quality and so forth of the pattern may be degraded, and thus performance and production yield of semiconductor devices and liquid crystal display panels may be degraded.

For this reason, these operations are usually performed in a clean room. However, because it is difficult to keep a substrate to be exposed by light always clean even in such a clean room, a pellicle well transmitting light is applied on a surface of substrate to be exposed by light in order to prevent adhesion of dust particles on the substrate.

When a pellicle is applied, dust particles do not adhere directly on the surface of substrate to be exposed with light, but on the pellicle membrane. Therefore, if the light is focused on the pattern of the substrate to be light-exposed during the photolithography process, the presence of such dust particles does not influence on the pattern transfer.

The pellicle has conventionally been produced by adhering a pellicle membrane made of a cellulosic organic resin well transmitting light such as nitrocellulose (cellulose nitrate) and cellulose acetate to a pellicle frame made of aluminum, stainless steel or the like, of which upper part is applied with a solvent well dissolving the pellicle membrane before setting and dried in air, or adhering the pellicle membrane to the frame with an adhesive comprising acrylic resin, epoxy resin or the like.

In recent years, as semiconductor devices have become further finer, resolution required in photolithography has gradually become higher. And in order to realize such resolution, light of shorter wavelength has gradually been used as a light source. Specifically, ultraviolet lights (g-line, wavelength of 436 nm and i-line, wavelength of 365 nm) are currently replaced with far-ultraviolet lights (KrF excimer laser, wavelength of 248 nm), and vacuum ultraviolet lights (ArF excimer laser, wavelength of 193 nm) and fluorine excimer laser (wavelength of 158 nm) are ready to be put into practical use in near future.

By the way, as the material of pellicle membranes, the aforementioned organic resins having functional groups such as carbonyl groups in their molecular structures have conventionally been used in order to obtain high transmission. However, these resins absorb lights having a wavelength of 200 nm or more and suffer from photodegradation. Therefore, amorphous fluorinated polymers not comprising these functional groups, and comprising only saturated bonds are used as the membrane material of pellicles for far-ultraviolet lights. However, although these amorphous fluorinated polymers show high transmission for a wavelength up to around 180 nm, they shows significant absorption and very poor transmission for lights of a wavelength smaller than the wavelength mentioned above. Therefore, it is difficult to use them for pellicle membranes for fluorine excimer laser.

On the other hand, silicon oxide, which is an inorganic substance, shows high transmission also for ultraviolet lights, and is used for the material of photomask and so forth. Use of silicon oxide for the material of pellicle membranes has also been proposed (see Japanese Patent Unexamined Publication (Kokai) Nos. 63-26251 and 2-62542). However, since usual silicon oxide shows significant absorption for a wavelength of 180 nm or less, it cannot be used as pellicle membranes for fluorine excimer laser.

SUMMARY OF THE INVENTION

The present invention has been accomplished in view of the aforementioned problems, and its main object is to provide a pellicle for photolithography consisting of a pellicle membrane which shows high light transmission and excellent durability, even when it is irradiated with vacuum ultraviolet lights of a short wavelength, i.e., 160 nm or less.

The present invention has been accomplished in order to achieve the aforementioned object, and provides a pellicle for photolithography comprising at least a pellicle membrane adhered to a pellicle frame, characterized in that the pellicle membrane exhibits light transmission of 50% or more when it is irradiated by an excimer laser having a wavelength of 160 nm or less.

If a pellicle membrane shows a light transmission of 50% or more when it is irradiated by an excimer laser having a wavelength of 160 nm or less, it can maintain high light transmission and high resolution even when it is irradiated with a vacuum ultraviolet light of short wavelength. Therefore, it can be a pellicle of long life and high performance.

In a preferred embodiment of the aforementioned pellicle of the present invention, a material of the pellicle membrane may be an inorganic fluoride compound.

A pellicle membrane comprising an inorganic fluoride compound can surely maintain high light transmission even when it is irradiated with a vacuum ultraviolet light of short wavelength, and does not cause photodegradation. Therefore, it can be a pellicle of long life and high performance.

In the aforementioned preferred embodiment of the pellicle of the present invention, calcium fluoride or magnesium fluoride is preferably selected as the inorganic fluoride compound.

Calcium fluoride and magnesium fluoride intrinsically have a wide light transmission wavelength range, and show no substantial absorption for vacuum ultraviolet lights. Therefore, by using these compounds as the material of the pellicle membrane, a pellicle showing high transmission in that region can be obtained.

In another embodiment of the pellicle according to the present invention, the pellicle membrane may comprise silicon oxide containing 10 ppm or less of OH groups.

A pellicle comprising silicon oxide containing 10 ppm or less of OH groups as the material of the pellicle membrane can be used for laser beam of a short wavelength, i.e., 160 nm or less, for which conventional silicon oxide membranes cannot be used. In addition, it does not cause degradation, and hence it can maintain high transmission. Therefore, the pellicle can be a pellicle of long life and high performance.

Further, the present invention provides the pellicle for photolithography, wherein material of the pellicle membrane is silicon oxide doped with fluorine.

A pellicle comprising silicon oxide doped with fluorine as the material of the pellicle membrane can be used for laser lights of a short wavelength, 160 nm or less, for which conventional silicon oxide membranes cannot be used. Therefore, it can afford the same advantages as mentioned above.

OH group content of the silicon oxide doped with fluorine is preferably 10 ppm or less.

If the pellicle comprises silicon oxide having an OH group content of 10 ppm or less and doped with fluorine, the advantages mentioned above can be further enhanced by the effects of low OH group content and doping with fluorine.

According to the present invention, there is also provided the pellicle for photolithography wherein the pellicle membrane is adhered to the pellicle frame with an elastic adhesive.

Strain and deformation are likely to occur when a pellicle membrane consisting of an inorganic material, which is generally rigid, is used. By adhering the pellicle membrane to the pellicle frame with an elastic adhesive, such strain or deformation of the pellicle frame can be ameliorated.

In the aforementioned embodiment of the pellicle of the present invention, the elastic adhesive may be a silicone elastic adhesive.

By using a silicone elastic adhesive as the elastic adhesive, the advantage of the amelioration of strain or deformation of the pellicle frame can further be enhanced.

The pellicle for photolithography according to the present invention can be used for fluorine excimer laser.

Light transmission of the pellicle for photolithography according to the present invention is not reduced even when it is used for fluorine excimer laser. Therefore, the pellicle is particularly advantageous for photolithography using the laser light.

By using inorganic fluoride compounds, silicon oxide having an OH content of 10 ppm or less, or silicon oxide doped with fluorine as a material of pellicle membranes as defined in the present invention, there can be provided pellicles for photolithography which can realize high transmission and high resolution in the vacuum ultraviolet region corresponding to a wavelength of 160 nm or less, because those materials have a wide transmission wavelength range and show extremely low light absorption in the vacuum ultraviolet region.

DESCRIPTION OF THE INVENTION AND EMBODIMENTS

Embodiments of the present invention will be explained hereinafter. However, the present invention is not limited to them.

The inventors of the present invention eagerly studied in order to attain the aforementioned object. As a result, they found that a pellicle showing extremely low absorption for vacuum ultraviolet lights, i.e., a pellicle which realizes high transmission and high resolution in the vacuum ultraviolet region, could be obtained by using a material exhibiting light transmission of 50% or more when it is irradiated by an excimer laser at a wavelength of 160 nm or less as the material of the pellicle membrane, and examined various conditions for the above finding. Thus, they accomplished the present invention.

The pellicle membrane, the feature of the pellicle for photolithography of the present invention, will be explained in detail hereafter.

As the material of the pellicle membrane of the pellicle for photolithography of the present invention, any material may be used in principle, so long as it shows light transmission of 50% or more when it is irradiated by an excimer laser having a wavelength of 160 nm or less.

Although materials showing relatively high transmission when irradiated by ArF excimer laser having a wavelength of 193 nm have already reported as mentioned above, there have never been any pellicle membrane showing high transmission when it is irradiated by an excimer laser having a wavelength shorter than that of an ArF excimer laser, i.e., 160 nm or less.

Specific examples of excimer laser having a wavelength of 160 nm or less include a fluorine excimer laser (wavelength: 158 nm), $Kr_2$ excimer laser (wavelength: 146 nm), $Ar_2$ excimer laser (wavelength: 126 nm) and so forth.

It has been empirically recognized that desired patterning of semiconductor devices such as LSIs can be realized without degrading resolution by using a material showing transmission of 50% or more, preferably 70% or more, more preferably 80% or more, when it is irradiated by an excimer laser, as the material of pellicle membranes.

The inventors of the present invention studied various materials in order to find materials having such properties and hence suitable for the material of pellicle membranes. As a result, they found that inorganic fluoride compounds, silicon oxide having an OH group content of 10 ppm or less and silicon oxide doped with fluorine showed a wide transmission wavelength range and extremely low absorption in the vacuum ultraviolet region. Therefore, they found that pellicles showing high transmission and low degradation, i.e., high durability, can be obtained by using any of these materials as the material of pellicle membranes used for a short wavelength of 160 nm or less. Thus, the aforementioned object has been attained.

First, pellicle membranes whose material is inorganic fluoride compounds will be explained.

Examples of the inorganic fluoride compounds include sodium fluoride, potassium fluoride, calcium fluoride, magnesium fluoride, strontium fluoride, barium fluoride, scandium fluoride, titanium fluoride, copper fluoride, zinc fluoride and so forth.

It was found that, among the aforementioned fluoride compounds, in particular, calcium fluoride and magnesium fluoride showed an extremely broad transmission wavelength range, i.e., 130 nm to 10 μm, and extremely low absorption in the vacuum ultraviolet region. Therefore, by using calcium fluoride or magnesium fluoride as the material of pellicle membranes, pellicles of high performance such as high transmission and long life can easily be obtained with a low cost.

When an inorganic fluoride is used as a pellicle membrane, it can be made into a thin membrane. The method for producing a thin membrane is not particularly limited, and known conventional methods can be used. For example, such a membrane can be obtained by cutting out a plate in a pellicle size from an inorganic fluoride crystal, and subjecting the plate to optical polishing. Alternatively, such a membrane can be obtained by forming a membrane on a flat substrate such as silicone wafer or quartz plate by spattering, and then removing the substrate.

If the thickness of the pellicle membrane is smaller than 1 μm, its membrane strength may be insufficient when it is made into a membrane. On the other hand, when the thickness is 20 mm or more, light transmission may be lowered. Therefore, it is preferably in the range of 1 μm to 20 mm, and the thickness within the range of 10 μm to 10 mm can surely obviate the aforementioned problems.

Then, silicon oxide having an OH group content of 10 ppm or less and silicon oxide doped with fluorine will be explained.

Light transmission for a wavelength of 160 nm or less is lowered also in the previously proposed silicon oxide as in the amorphous fluorinated polymers. Therefore, the inventors of the present invention studied in order to solve this problem. As a result, it was found that use of silicon oxide having an OH group content of 10 ppm or less or silicon oxide doped with fluorine was effective. That is, it was found that silicon oxide having an OH group content of 10 ppm or less or doped with fluorine had a light transmission wavelength range and exhibited high light transmission in the vacuum ultraviolet region corresponding to a wavelength of 160 nm or less. Thus, the aforementioned object has been attained.

The method for obtaining silicon oxide having an OH group content reduced to 10 ppm or less is not particularly limited. For example, such silicon oxide can be obtained by allowing a mixed gas of $SiCl_4$, oxygen and hydrogen to continuously react at 700° C. to obtain a deposition (soot), treating the deposition with chlorine, and then melting it.

The OH group content of the obtained silicon oxide can be measured by, for example, infrared spectroscopy (IR) analysis or solid proton NMR measurement.

A desired pellicle membrane can be obtained by processing the silicon oxide obtained as described above into a pellicle size, making the processed silicon oxide into a thin membrane, and subjecting the membrane to optical polishing.

The method of obtaining silicon oxide doped with fluorine is not also particularly limited. For example, it can be obtained by applying radio-frequency to a mixed gas of $SiH_4$, oxygen and $SiF_4$ to form a thin membrane of vitrified silicon oxide doped with fluorine on a substrate.

In order to surely attain the aforementioned object with the obtained silicon oxide doped with fluorine, it is preferred that its OH group content is controlled to be 10 ppm or less.

In order to obtain such silicon oxide having a reduced content of OH group and doped with fluorine, a mixed gas of $SiCl_4$, oxygen and hydrogen can be allowed to continuously react at 700° C. to obtain a deposition (soot), and the deposition can be treated with chlorine at 1200° C. and then sintered at 1200° C. under $SiF_4$ gas atmosphere. The OH group content can be confirmed by infrared spectroscopic analysis or the like as mentioned above.

Then, a desired pellicle membrane can be obtained by processing the silicon oxide obtained as described above into a pellicle size, and subjecting the processed silicon oxide to optical polishing.

If the thickness of the obtained pellicle membrane is smaller than 1 μm, its membrane strength may be insufficient when it is made into a membrane. On the other hand, when the thickness is 20 mm or more, light transmission may be lowered. Therefore, it is preferably in the range of 1 μm to 20 mm, and particularly desirably within the range of 10 μm to 10 mm in order to obviate the aforementioned problems.

As described above, the pellicle for photolithography of the present invention is characterized by comprising a pellicle membrane that can realize excellent transmission and high resolution in the vacuum ultraviolet region. That is, it is a pellicle for photolithography characterized by having a pellicle membrane made of any of the aforementioned materials.

When a pellicle membrane comprising any of the aforementioned materials is adhered to a pellicle frame to form a pellicle for photolithography, the membrane is preferably adhered to the frame with an elastic adhesive.

That is, when aluminum is used as the material of the pellicle frame and any of the aforementioned materials is used as a pellicle membrane, the membrane is preferably adhered to the frame with an elastic adhesive, because both of the frame and the membrane are rigid, which can absorb possible strain or deformation of the pellicle frame.

In this case, specific hardness of the elastic adhesive is preferably in the range of 10–90, more desirably 20–80 in terms of the hardness defined by JIS-K-6253 (A-type durometer method). This is because a hardness less than 10 makes the pellicle frame likely to deform, and a hardness more than 90 may reduce the absorption of deformation.

As the elastic adhesive, there can be used elastomers having hydrolyzable groups enabling curing with moisture and elastomers having radically polymerizable groups such as vinyl group, acrylic group, methacrylic group and so forth enabling photocuring with ultraviolet rays or the like.

Further examples of such elastomers include silicone elastomers, polysulfide elastomers, polyurethane elastomers, acryl/urethane elastomers, polyvinyl chloride elastomers, chloroprene elastomers, chlorosulfonated polyethylene elastomers, ethylene/propylene elastomers, asphalt-containing polyurethane elastomers and so forth. These resins may also be used as an arbitrary mixture of two or more sorts of them.

Among these, a silicone resin, in particular, a room temperature curing-type silicone elastomer is preferably used in view of ease of handling, light resistance and so forth. Specifically, preferably used are room temperature curing-type silicone elastomers having methyl ethyl ketoxime groups, acetoxyl groups, alkoxyl groups, isopropenoxy groups, amino groups, amide groups and so forth as reactive groups causing curing at room temperature. Among those exemplified, more preferably used are room temperature curing-type silicone elastomers having acyloxyl groups, alkoxyl groups or isopropenoxy groups, which are suitable for electrical and electronic applications. In this case, while either of one-pack type silicone elastomers and two-pack type silicone elastomers may be used, it is preferable to use one-pack type room temperature-curing silicone elastomers showing good workability.

The pellicle for photolithography of the present invention obtained as described above does not show light absorption for a wavelength of 160 nm or less as described above, and it can show high transmission in a wide wavelength range. Therefore, the pellicle provides an advantage that energy provided to a substrate such as a silicon wafer upon light exposure is increased. In addition, higher transmission leads to less light absorption, and thus it also affords an advantage concerning light resistance.

Furthermore, the pellicle of the present invention shows high transmission even when it is irradiated by an excimer laser having a wavelength of 160 nm or less, which cannot have been realized by conventional pellicles, and the transmission is not degraded. In particular, it exhibits high transmission and characteristics of the pellicle membrane are not degraded, even when it is irradiated by a fluorine excimer laser which has been impossible to be used for conventional pellicles. Therefore, it is particularly useful as a pellicle for photolithography using a fluorine excimer laser.

EXAMPLES

The present invention will be explained with reference to the following examples and comparative examples.

Example 1

A calcium fluoride crystal was cut into a pellicle size of 149 mm×122 mm, and processed into a plate having a thickness of 1 mm. The both surfaces of the crystal plate were subjected to optical polishing. Then, the crystal plate was cleaned by ultrasonic cleaning using an aqueous solution of surface active agent and rinsed with pure water to obtain a clean crystal plate without dust particles.

A one-pack type silicone elastic adhesive (KE42, produced by Shin-Etsu Chemical Co., Ltd.) having a hardness of 30 according to JIS-K-6253 (A-type durometer method) was applied to one end surface of a pellicle frame made of aluminum, and the calcium fluoride crystal plate obtained above was adhered to the pellicle frame.

When the transmission of this pellicle was then measured by irradiating it with a fluorine excimer laser light (158 nm), it exhibited a transmission of 85%. The result of this measurement is shown in Table 1.

Example 2

A magnesium fluoride crystal was cut into a pellicle size of 149 mm×122 mm, and processed into a plate having a thickness of 1 mm. The both surfaces of the crystal plate were subjected to optical polishing. Then, the crystal plate was cleaned by ultrasonic cleaning using an aqueous solution of surface active agent and rinsed with pure water to obtain a clean crystal plate without dust particles. The obtained magnesium fluoride crystal plate was adhered to a pellicle frame in the same manner as in Example 1.

When the transmission of this pellicle was then measured by irradiating it with a fluorine excimer laser light, it exhibited a transmission of 83%. The result of this measurement is shown in Table 1.

Example 3

A mixed gas consisting of 200 cc/min of $SiCl_4$, 400 cc/min of oxygen and 800 cc/min of hydrogen was allowed to continuously react at 700° C. to obtain a deposition (soot). This deposition was treated at 500° C. under a chlorine gas flow of 200 cc/min, and then melted at 1200° C. to obtain silicon oxide with a reduced content of OH groups. When this silicon oxide was analyzed by IR (infrared spectroscopy), it was found to have an OH group content of 1 ppm.

The silicon oxide was processed into a pellicle size of 149 mm×122 mm, made into a thin membrane, and subjected to optical polishing to obtain a silicon oxide membrane having a thickness of 400 μm with a reduced content of OH groups. Then, it was adhered to an aluminum pellicle frame in the same manner as in Example 1 to obtain a pellicle.

When the transmission of this pellicle was then measured by irradiating it with a fluorine excimer laser light, it exhibited a transmission of 81%. The result of this measurement is shown in Table 1.

Example 4

By flowing a mixed gas consisting of 20 cc/min of $SiH_4$, 50 cc/min of $SiF_4$ and 50 cc/min of oxygen on a silicon substrate having a thickness of 400 μm, and applying radio-frequency of 13.56 MHz to it, a silicon oxide membrane having a thickness of 50 μm and doped with fluorine was formed on the substrate based on the radio-frequency magnetron sputtering. When the membrane was analyzed by an X-ray microanalyser, it was found to have atomic molar ratios of 32% for silicon, 62% for oxygen and 6% for fluorine. When it was analyzed by IR (infrared spectroscopy), it was found to have an OH group content of 200 ppm.

The substrate with the membrane was dipped into a mixture of 95 ml of 65% aqueous solution of $HNO_3$, 5 ml of 40% aqueous solution of HF and 1 g of $NaNO_3$ to etch the silicon substrate. Thus, a silicon oxide membrane doped with fluorine was obtained. This membrane was cut into a size of 149 mm×122 mm, and adhered to an aluminum pellicle frame in the same manner as in Example 1 to obtain a pellicle.

When the transmission of this pellicle was then measured by irradiating it with a fluorine excimer laser light, it exhibited a transmission of 85%. The result of this measurement is shown in Table 1.

Example 5

A mixed gas consisting of 100 cc/min of $SiH_4$, 200 cc/min of $SiF_4$ and 500 cc/min of oxygen was allowed to continuously react at 700° C. to obtain a deposition (soot). This deposition was sintered at 1200° C. under $SiF_4$ gas atmosphere to obtain silicon oxide glass doped with fluorine. When the glass was analyzed by an X-ray microanalyser, it was found to have atomic molar ratios of 32% for silicon, 64% for oxygen and 4% for fluorine. When it was analyzed by IR (infrared spectroscopy), it was found to have an OH group content of 250 ppm.

The glass was cut into a plate having a thickness of 1 mm, and subjected to optical polishing to obtain a silicon oxide membrane having a thickness of 400 μm and doped with fluorine. This membrane was cut into a size of 149 mm×122 mm, and adhered to an aluminum pellicle frame in the same manner as in Example 1 to obtain a pellicle.

When the transmission of this pellicle was then measured by irradiating it with a fluorine excimer laser light, it exhibited a transmission of 83%. The result of this measurement is shown in Table 1.

Example 6

A mixed gas consisting of 200 cc/min of $SiCl_4$, 400 cc/min of oxygen and 800 cc/min of hydrogen was allowed to continuously react at 700° C. to obtain a deposition (soot). This deposition was treated at 500° C. under a chlorine gas flow of 200 cc/min, and then sintered at 1200° C. under $SiF_4$ gas atmosphere to obtain silicon oxide glass having a reduced content of OH group and doped with fluorine. When the glass was analyzed by an X-ray microanalyser, it was found to have atomic molar ratios of 32% for silicon, 64% for oxygen and 4% for fluorine. When it was analyzed by IR (infrared spectroscopy), it was found to have an OH group content of 0.8 ppm.

The glass was cut into a plate having a thickness of 1 mm, and subjected to optical polishing to obtain a silicon oxide membrane having a thickness of 400 μm and a reduced content of OH group, and doped with fluorine. This membrane was cut into a size of 149 mm×122 mm, and adhered to an aluminum pellicle frame in the same manner as in Example 1 to obtain a pellicle.

When the transmission of this pellicle was then measured by irradiating it with a fluorine excimer laser light, it exhibited a transmission of 88%. The result of this measurement is shown in Table 1.

Comparative Example 1

Cytop (tradename of Asahi Glass Co., Ltd.) as a material of membrane was dissolved in a solvent for it, CTsolv. 180

(tradename of Asahi Glass Co., Ltd.) to obtain its 5% solution. Then, the solution was coated on a silicon substrate with a polished surface by using a spin coater to form a transparent membrane having a membrane thickness of 1 µm. Then, the membrane was peeled off from the silicon substrate, and adhered to an aluminum pellicle frame in the same manner as in Example 1 to obtain a pellicle.

When the transmission of this pellicle was measured, it exhibited an extremely low transmission of 2% for fluorine excimer laser light as shown in Table 1.

Comparative Example 2

Synthetic quartz, VIOSIL (produced by Shin-Etsu Chemical Co., Ltd.), as a material of membrane was subjected to optical polishing to obtain a silicon oxide membrane with a thickness of 500 µm. When its OH group content was analyzed by IR (infrared spectroscopy), it was found to be 450 ppm. Then, it was adhered to an aluminum pellicle frame in the same manner as in Example 1 to obtain a pellicle.

When the transmission of this pellicle was then measured by irradiating with fluorine excimer laser light, it exhibited an extremely low transmission of 1%. The result of this measurement is shown in Table 1.

TABLE 1

| Light transmission for fluorine excimer laser light (%) | |
|---|---|
| Example 1 | 85 |
| Example 2 | 83 |
| Example 3 | 81 |
| Example 4 | 85 |
| Example 5 | 83 |
| Example 6 | 88 |
| Comparative Example 1 | 2 |
| Comparative Example 2 | 1 |

As clearly seen from the results shown in Table 1, pellicles having a pellicle membrane composed of conventionally used fluorinated resins such as Cytop show only a low transmission at a wavelength of 158 nm, which is the wavelength of fluorine excimer laser. Therefore, their functions as actual pellicles should be limited.

In contrast, the pellicles having pellicle membranes composed of inorganic fluoride compounds such as calcium fluoride and magnesium fluoride, silicon oxide having an OH content of 10 ppm or less, or silicon oxide doped with fluorine according to the present invention do not show strong absorption for a wavelength of 160 nm or less, and show an extremely high transmission even for a wavelength of 158 nm. Therefore, by using these materials including the inorganic fluoride compounds and the like as the material of pellicle membrane, there can be provided pellicles of high performance, which show high light transmission even in fluorine excimer laser photolithography.

The present invention is not limited to the embodiments mentioned above. The above-described embodiments are mere examples, and those having the substantially same features as those described in the appended claims and providing the similar functions and advantages are included in the scope of the present invention.

For example, while the present invention was specifically explained for fluorine excimer laser among excimer lasers having a wavelength of 160 nm or less, it exhibits the same effect also for other excimer lasers such as $Kr_2$ eximer laser and $Ar_2$ eximer laser.

What is claimed is:

1. A pellicle for photolithography comprising at least a pellicle membrane adhered to a pellicle frame, wherein the pellicle membrane exhibits light transmission of 50% or more when it is irradiated by an excimer laser having a wavelength of 160 nm or less.

2. The pellicle for photolithography according to claim 1, wherein material of the pellicle membrane is an inorganic fluoride compound.

3. The pellicle for photolithography according to claim 2, wherein the inorganic fluoride compound is calcium fluoride or magnesium fluoride.

4. The pellicle for photolithography according to claim 1, wherein material of the pellicle membrane is silicon oxide containing 10 ppm or less of OH groups.

5. The pellicle for photolithography according to claim 1, wherein material of the pellicle membrane is silicon oxide doped with fluorine.

6. The pellicle for photolithography according to claim 5, wherein the silicon oxide doped with fluorine has an OH group content of 10 ppm or less.

7. The pellicle for photolithography according to claim 1, wherein the pellicle membrane is adhered to the pellicle frame with an elastic adhesive.

8. The pellicle for photolithography according to claim 7, wherein the elastic adhesive is a silicone elastic adhesive.

9. The pellicle for photolithography according to claim 1, wherein the pellicle for photolithography is used for vacuum ultraviolet lights.

10. The pellicle for photolithography according to claim 1, wherein the pellicle for photolithography is used for a fluorine excimer laser, $Kr_2$ excimer laser or $Ar_2$ excimer laser.

11. The pellicle for photolithography according to claim 1, wherein the pellicle for photolithography is used for a fluorine excimer laser.

* * * * *